(12) United States Patent
Hsieh et al.

(10) Patent No.: US 9,514,846 B2
(45) Date of Patent: Dec. 6, 2016

(54) MEMORY MODULE STATUS INDICATION

(71) Applicant: LENOVO ENTERPRISE SOLUTIONS (SINGAPORE) PTE. LTD, New Tech Park (SG)

(72) Inventors: Tsung-Hsuan Hsieh, Banqiao (TW); Kuei Huang Liu, Changhua (TW)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 367 days.

(21) Appl. No.: 14/173,968

(22) Filed: Feb. 6, 2014

(65) Prior Publication Data
US 2014/0223032 A1 Aug. 7, 2014

(30) Foreign Application Priority Data

Feb. 6, 2013 (TW) .............................. 102104530 A

(51) Int. Cl.
*G06F 3/00* (2006.01)
*G11C 29/44* (2006.01)
*G06F 11/32* (2006.01)
*G11C 5/04* (2006.01)
*G11C 29/04* (2006.01)
*G11C 29/56* (2006.01)

(52) U.S. Cl.
CPC ............. *G11C 29/44* (2013.01); *G06F 11/325* (2013.01); *G11C 5/04* (2013.01); *G11C 2029/0407* (2013.01); *G11C 2029/0409* (2013.01); *G11C 2029/5604* (2013.01)

(58) Field of Classification Search
None
See application file for complete search history.

(56) References Cited

U.S. PATENT DOCUMENTS

| 4,251,883 | A | * | 2/1981 | Grants | G05B 19/058 361/92 |
|---|---|---|---|---|---|
| 6,987,927 | B1 | * | 1/2006 | Battaglia | G11C 5/141 358/909.1 |
| 7,028,213 | B2 | * | 4/2006 | Majni | G06F 11/108 714/42 |
| 7,129,851 | B1 | | 10/2006 | Garnett | |
| 8,321,703 | B2 | | 11/2012 | Berard et al. | |
| 2006/0005000 | A1 | | 1/2006 | King et al. | |
| 2007/0016737 | A1 | * | 1/2007 | Bungo | G06F 12/1458 711/156 |
| 2009/0213938 | A1 | * | 8/2009 | Lee | H04N 19/70 375/240.24 |
| 2011/0144951 | A1 | | 6/2011 | Lieberman et al. | |

* cited by examiner

*Primary Examiner* — Michael Sun
(74) *Attorney, Agent, or Firm* — Katherine Brown

(57) ABSTRACT

Embodiments of the inventive subject matter include receiving, from an interface module, status data for a memory module, wherein the memory module includes a plurality of status indicators. Embodiments further include determining, based on the status data, a set of the plurality of status indicators to illuminate. Embodiments further includes generating, in accordance with the determining the set of the plurality of status indicators based on the status data, a plurality of commands for controlling illumination of the set of the plurality of status indicators. Embodiments further include transmitting the plurality of commands to circuitry of the memory module that controls the plurality of status indicators.

15 Claims, 3 Drawing Sheets

MEMORY MODULE STATUS INDICATION

This application claims priority under 35 U.S.C. §119 from Taiwan Patent Application 102104530, filed on Feb. 6, 2013, which is incorporated by reference in its entirety.

BACKGROUND OF THE INVENTION

Field of the Invention

The present invention relates to information technology generally, and more particularly, to memory module status indication technology.

Description of the Prior Art

The operation status of a conventional memory module, such as a dual in-line memory module (DIMM), is usually visually indicated by a DIMM fault-oriented light-emitting diode (LED) mounted on a mainboard. From the perspective of the memory module, its status-related information is automatically accessed by a serial presence detect (SPD). According to the prior art, a baseboard management controller (BMC) interprets SPD data to thereby control the display of the DIMM fault-oriented LED.

Conventional memory modules provide information pertaining to DIMM faults in a simple manner but do not provide any failure type or any other DIMM-related data, and consequently are not effective in debugging. Furthermore, BMCs, especially the high-level BMCs, are expensive and thus not cost-effective.

Hence, from the perspective of memory module related technology, there is a demand for memory module status indication which is inexpensive and effective in indicating memory module statuses in a thorough and readily-discerned manner to facilitate debugging, and analyzing failure.

SUMMARY OF THE INVENTION

In some embodiments, the present invention provides a memory module status indication technique which incurs low costs, features high debugging efficiency, and is effective in indicating memory module statuses in a readily-discerned manner, debugging, and analyzing failure.

In some embodiments of the present invention, a memory module status indication method is applied to an information processing system. The memory module comprises a status data module and a status indication module. The information processing system comprises an I/O control module, an interface firmware module electrically coupled between the I/O control module and the status data module, and a decoder module electrically coupled between the I/O control module and the memory module. The status indication method comprises the steps of reading the status data module by the interface firmware module to obtain a status data of the memory module; transmitting the status data by the interface firmware module to the I/O control module; generating a control command for controlling the status indication module and transmitting the control command to the decoder module by the I/O control module in response to the status data; and decoding the control command by the decoder module to generate a decoded control command for controlling the status indication module.

In some embodiments of the present invention, the information processing system further comprises a central processing unit (CPU) electrically coupled to the interface firmware module. The interface firmware module has a UEFI code. The status indication method further comprises, after a boot, the step of loading the UEFI code from the interface firmware module onto the CPU to perform an initialization procedure.

In some embodiments of the present invention, the status data module comprises a serial presence detect (SPD) chip, and the status indication module comprises a light-emitting diode (LED) apparatus, a visual status indication apparatus, an alert module, or a buzzer.

In some embodiments of the present invention, the LED apparatus comprises a plurality of LEDs, and the memory module further comprises an LED circuit for receiving the decoded control command to control illumination (i.e., on/off) of the plurality of LEDs.

In some embodiments of the present invention, the I/O control module comprises an I2C bus controller, and the decoder module comprises an I2C decoder.

In some embodiments of the present invention, a memory module comprises a carrying board, a status data module, and a status indication module, applies to an information processing system, and executes the aforesaid method.

In some embodiments of the present invention, a memory module status indication apparatus comprises: a memory module comprising a status data module and a status indication module; an interface firmware module electrically coupled to the status data module and adapted to read the status data module so as to obtain a status data of the memory module; an I/O control module electrically coupled to the interface firmware module and adapted to receive the status data from the interface firmware module and generate, in response to the status data, a control command for controlling the status indication module; and a decoder module electrically coupled between the I/O control module and the status indication module and adapted to receive the control command from the I/O control module, decode the control command, and generate a decoded control command for controlling the status indication module.

Some embodiments of the present invention include a mainboard comprising: a motherboard; a central processing unit (CPU); and the aforesaid memory module status indication apparatus.

Some embodiments of the present invention include an information processing system comprising: a motherboard; a central processing unit (CPU); the aforesaid memory module status indication apparatus; and a casing for containing elements.

Reference throughout this specification to features, advantages, or similar language does not imply that all of the features and advantages that may be realized with the present invention should be or are in any single embodiment of the present invention. Rather, language referring to the features and advantages is understood to mean that a specific feature, advantage, or characteristic described in connection with an embodiment is included in at least one embodiment of the. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The following description, the appended claims, and the embodiments of the present invention further illustrate the features and advantages of the present invention.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings.

DETAILED DESCRIPTION OF THE EMBODIMENTS

Figure 1:
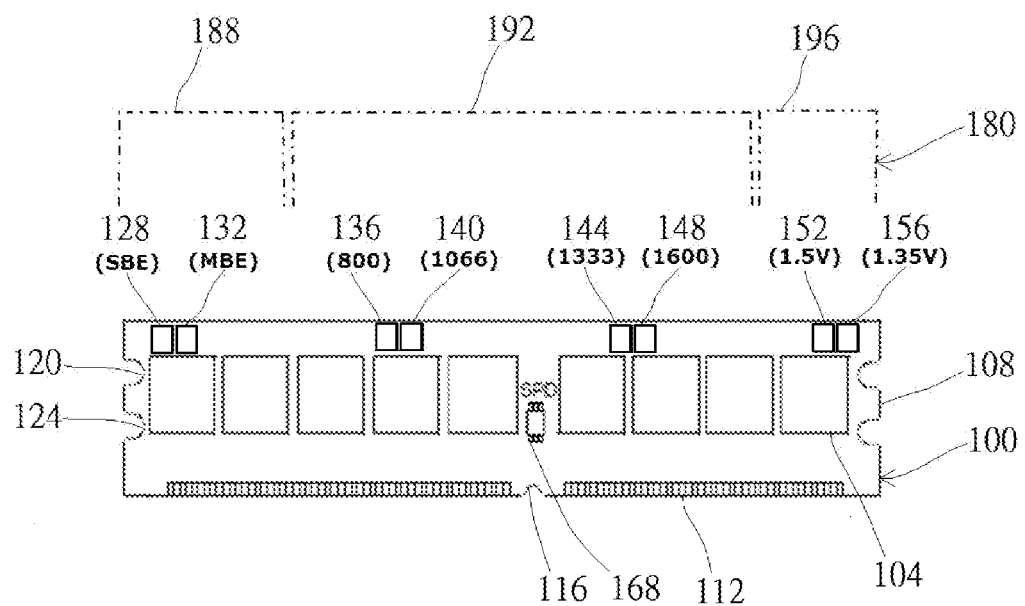
FIG. 1 is a schematic front view of a memory module according to an embodiment of the present invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 1, there is shown a schematic front view of a memory module 100 (for example, including but not limited to a DIMM) according to a preferred embodiment of the present invention. The DIMM 100 is typically designed to carry a printed circuit card 108 having a plurality of DRAMs 104. Output pins (not shown) of the DRAMs 104 run along the edges of the front end and rear end of the printed circuit card 108 and connect to contacts 112 by means of a printed circuit (not shown). In general, a positioning key 116 is disposed at the edge of the contacts 112. Slots 120, 124 are disposed at the two ends of the DIMM 100. The contacts 112 are numbered and coupled to corresponding inputs of a connector system (not shown).

Referring to FIG. 1, the schematic front view of the DIMM 100, in a preferred embodiment of the present invention, a plurality of LEDs 180 is divided into a plurality of LED areas, for example, including but not limited to an error type area 188, a speed area 192, and a voltage area 196, though the present invention is not limited thereto. Mounted on the error type area 188 are error type LEDs 128, 132 for indicating single bit errors (SBE) and multi bit errors (MBE), respectively. Mounted on the speed area 192 are speed LEDs 136, 140, 144, and 148 for indicating 800 MHz, 1066 MHz, 1333 MHz, 1600 MHz, respectively. Mounted on the voltage area 196 are voltage LEDs 152, 156 for indicating 1.5V, 1.35V, respectively. The LEDs 128, 132, 136, 140, 144, 148, 152, 156 are bi-colored (e.g., yellow, green) indicators. By observing the indication status of the LEDs 128, 132, 136, 140, 144, 148, 152, 156, a user is informed of the operation status and failure of the DIMM 100. Related details are described later.

Referring to FIG. 1, a serial presence detect (SPD) chip 168 is disposed on the front of the DIMM 100. In general, the SPD chip 168 comes in the form of an electrically erasable programmable read only memory (EEPROM) which stores SPD data, including specification items, such as memory clock settings and voltage, and checksums.

From the perspective of the DIMM 100, an interface firmware module 204 (shown in FIG. 2) of an information processing system 200 (shown in FIG. 2) comes in the form of a nonvolatile memory chip, for example, and has a universal extensible firmware interface (UEFI), an extensible firmware interface (EFI), a basic input/output system (BIOS), or any other firmware. The interface firmware module 204 is defined as a module for providing a standard for an interface between a computer operating system and computer hardware. The interface firmware module 204 is configured in accordance with SPD data (i.e., memory parameters) provided by the manufacturer of the DIMM 100. Hence, the interface firmware module 204 reads the SPD chip 168, such that a booting procedure begins by configuring memory speed and voltage level in accordance with the specification provided by SPD.

Furthermore, the dimensions of the DIMM 100, for example, include but are not limited to 133.35 mm×30 mm. The width and length of the DIMM 100 will not be regarded as important consideration factors, provided that the DIMM 100 is wide enough to accommodate the DRAMs 104 mounted thereon. The DIMM 100 is long enough to accommodate sufficient contacts 112, DRAMs 104, and positioning keys 116. Of course, the DIMM 100 can, as needed, come in any dimensions other than the aforesaid ones in order to accommodate different numbers of DRAMs 104, and come with different types of memories, but the present invention is not limited thereto.

Figure 2:
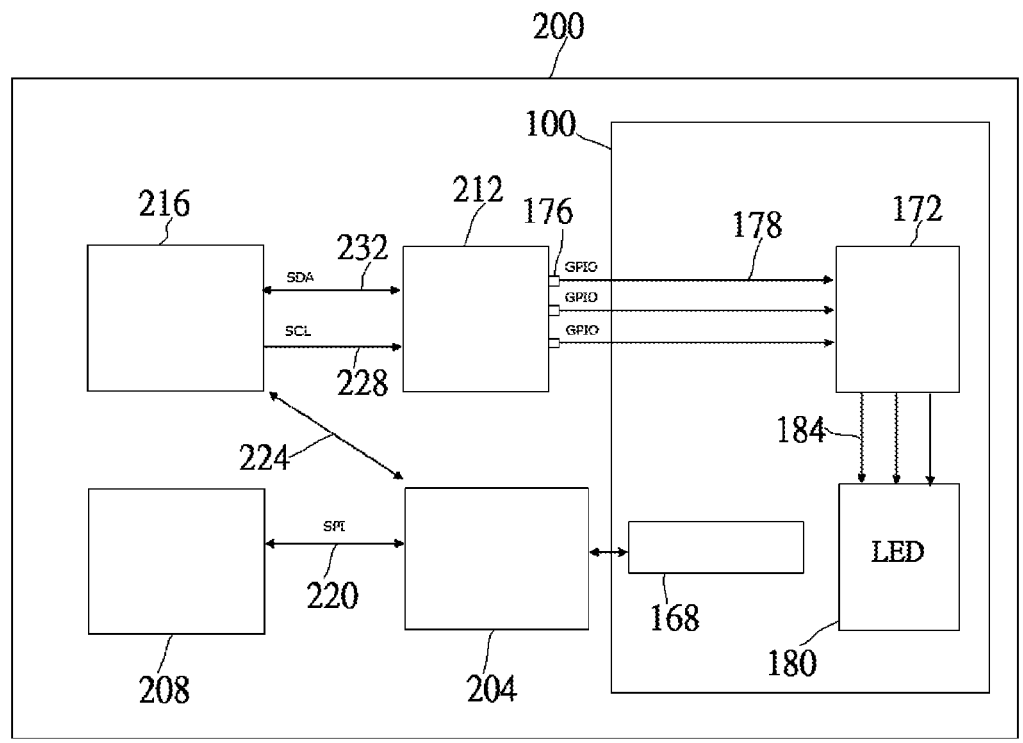
FIG. 2 is a block diagram of an information processing system according to an embodiment of the present invention.

Referring to FIG. 2, there is shown a block diagram of the information processing system 200 (for example, including but not limited to a server) constructed according to an embodiment of the present invention, and a server memory is installed therein for an illustrative purpose. Although, in practice, a plurality of DIMMs is required, FIG. 2 shows one said DIMM 100 for an illustrative purpose. In another aspect, for example, the information processing system 200 of the present invention comes in the form of a mobile computing apparatus, a notebook computer, a desktop computer, a network server, a client end, or any computing apparatus equipped with firmware, and comprises a central processing unit (CPU) 208 for executing various tasks. Any other apparatuses can be coupled to the CPU 208 in accordance with functions executable by the information processing system 200. The information processing system 200 further comprises a mainboard (not shown) on which components are mounted and electrically connected to each other. As mentioned earlier, the information processing system 200 comprises the DIMM 100 inserted into and coupled to the mainboard by means of a connector system (not shown).

As mentioned earlier, the information processing system 200 comprises an interface firmware module 204. In a specific embodiment of the present invention, the interface firmware module 204 has a UEFI code whereby the CPU 208 executes an initialization procedure for the information processing system 200, but the present invention is not limited thereto. To enable the information processing system 200 to boot, the CPU 208 fetches program code from the interface firmware module 204 mounted on the mainboard. The program code in the interface firmware module 204 controls related initialization operations of the information processing system 200. The related initialization operations mainly include a power-on self-test (POST), initialization, and testing. Hence, as soon as the information processing system 200 boots, it surrenders its control authority to the UEFI. Then the UEFI checks whether registers and flags of the CPU 208 are functioning properly. Afterward, the UEFI checks whether a timer and a direct memory access controller (DMA controller) are functioning properly. Furthermore, the BIOS initializes chipsets, memories, and registers of any other peripheral apparatuses. The interface firmware module 204 further executes the following: approaching an operating system, providing an interface whereby the operating system and hardware are connected, and loading the operating system onto a system memory of the information processing system 200. The CPU 208 is coupled to the I/O system module 204 via a link 220, such as a serial peripheral interface (SPI) bus or a low pin count (LPC) bus, for example.

In a specific embodiment of the present invention, the information processing system 200 further comprises an I/O control module 216, for example, including but not limited to a I2C bus controller for controlling the LEDs 180 of the DIMM 100. The I/O control module 216 connects electrically to and communicates with the interface firmware module 204 via a trace 224. After the information processing system 200 has been booted, the CPU 208 loads the UEFI code for performing an initialization procedure. The interface firmware module 204 reads SPD data (including error type, speed, and voltage) in the SPD chip 168 and transmits the SPD data thus read to the I/O control module 216. Upon communication between the interface firmware module 204 and the I/O control module 216, the I/O control module 216 sends, in accordance with the SPD data, an LED on/off command to a decoder module 212 of the information processing system 200, for example, including but not limited to a I2C decoder.

Referring to FIG. 2, in a specific embodiment, the I2C decoder 212 is for use in decoding I2C packet contents. In this specific embodiment, the I2C decoder 212 is for use in decoding the LED on/off command transmitted from the I/O control module 216 and transmitting a decoded LED on/off command to the DIMM 100 so as to perform on/off operations of the LEDs 180. The DIMM 100 further comprises an LED circuit 172 for driving the plurality of LEDs 180. The LED circuit 172 is coupled to the plurality of LEDs 180 by a trace 184. The I2C bus controller 216 is electrically connected to the I2C decoder 212 via I2C buses 232, 228. The I2C buses 232, 228 are half-duplex synchronous multiple apparatus buses which require only two signal lines, namely serial data line (SDA) 232 and serial clock line (SCL) 228 and typically provide two addressing modes and three transmission modes. The I2C decoder 212 is electrically connected to the LED circuit 172 via a trace 178. In a specific embodiment, electrical connection is effectuated by a general-purpose input/output (GPIO) pin 176 of the I2C decoder 212.

The information processing system 200 of the present invention further comprises various functional units. For the sake of brevity of drawings and description, the diagrams show only elements pertaining to the present invention, whereas the hardware framework, such as an integrated management module (IMM), is not shown in the diagrams.

For the other fundamental frameworks and components of the information processing system 200, make reference to general personal computers or servers, such as IBM's System X, Blade Center or eServer server. Details not related to the present invention are omitted from the description of the present invention.

Figure 3:
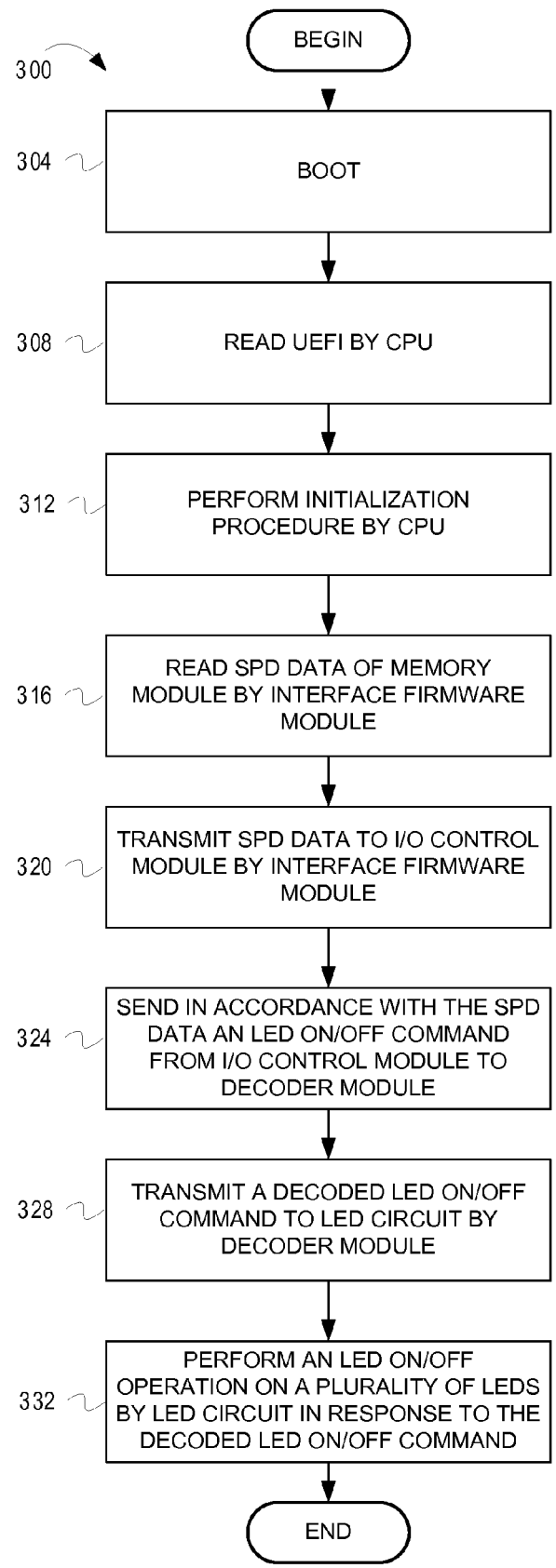
FIG. 3 is a schematic view of the process flow of a memory module status indication method according to an embodiment of the present invention.

Referring to FIG. 3, there is shown a schematic view of the process flow of a method 300 of memory module status indication according to a preferred embodiment of the present invention. The present invention is hereunder illustrated with the hardware framework shown in FIG. 1 and FIG. 2 and the flow chart shown in FIG. 3. The method 300 of FIG. 3 comprises steps as follows:

Step 304: booting, in a specific embodiment.

Step 308: reading a UEFI of the interface firmware module 204 by the CPU 208. In a specific embodiment, the CPU 208 receives a power signal for preparing the execution of a booting procedure; meanwhile, the CPU 208 loads the UEFI from the interface firmware module 204.

Step 312: performing an initialization procedure by the CPU 208.

Step 316: reading SPD data (including error type, speed, and voltage) in the SPD chip 168 (i.e., status data module) of the memory module 100 by the interface firmware module 204.

Step 320: the interface firmware module 204 communicates with the I/O control module 216 and transmits the SPD data to the I/O control module 216.

Step 324: the I/O control module 216 sends, in accordance with the SPD data, an LED on/off command to the decoder module 212 (including but not limited to an I2C decoder) for decoding.

Step 328: transmitting a decoded LED on/off command to the LED circuit 172 by the decoder module 212

Step 332: performing an LED on/off operation on the status indication module 180 (including but not limited to a plurality of LEDs) by the LED circuit 172 in response to the decoded. LED on/off command to thereby provide status indication of the memory module 100. Referring to FIG. 1, the LEDs 128, 132, 136, 140, 144, 148, 148, 152, 156 are bi-colored (e.g., yellow, green) indicators whose on/off indicates the presence/absence of the status. Of course, in another specific embodiment, it is feasible to use monochrome indicators, decrease the quantity of the LEDs 180, and/or replace the LEDs with the other behavior of indicators (for example, the flashing of the LEDs 180, and the present invention is not limited thereto.

The apparatus and method in the embodiments of the present invention, which provide the types of failure of the memory module 100 and the other DIMM-related situations and data at low costs and efficiently, are widely applicable to various situations and fit to be a highly flexible status indication solution.

Although the aforesaid embodiments are exemplified by LEDs which provide memory module status indication, persons skilled in the art are able to infer and identify easily more means of status indication, including but not limited to any other visual status indication apparatuses, alert modules, and buzzers. In another aspect, although the aforesaid embodiments are exemplified by the memory module 100 (i.e., the DIMM 100), persons skilled in the art are able to infer more said memory modules 100, including but not limited to single in-line memory modules (SIMM), RDRAM in-line memory modules (RIMM), and small outline dual in-line memory modules (SO-DIMM).

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims

What is claimed is:

1. A method comprising:
   receiving, from an interface module, status data for a memory module by retrieving serial presence detect (SPD) information stored on the memory module, wherein the memory module includes a plurality of status indicators, the SPD information includes a frequency at which the memory module is operative and a voltage at which the memory module is operative, and the status indicators include a plurality of voltage status indicators corresponding to a plurality of industry standard voltages including the voltage at which the memory module is operative and a plurality of frequency status indicators corresponding to a plurality of industry standard frequencies including the frequency at which the memory module is operative;

determining, based on the status data, a set of the plurality of status indicators to illuminate, including a selected voltage status indicator corresponding to the industry standard voltage at which the memory module is operative and a selected frequency status indicator corresponding to the industry standard frequency at which the memory module is operative;

generating, in accordance with said determining the set of the plurality of status indicators based on the status data, a plurality of commands for controlling illumination of the set of the plurality of status indicators; and transmitting the plurality of commands to circuitry of the memory module that controls the plurality of status indicators.

2. The method of claim 1, wherein the interface module comprises a non-volatile chip having one of a universal extensible firmware interface code, an extensible firmware interface code, and a basic input/output system code.

3. The method of claim 1, wherein the memory module comprises one of a double in-line memory module, a single in-line memory module, a dynamic random access memory in-line memory module, and a small outline dual in-line memory module.

4. The method of claim 1, wherein the plurality of status indicators are light emitting diodes.

5. The method of claim 1, wherein a first voltage status indicator indicates a first industry standard voltage, a second voltage status indicator indicates a second industry standard voltage, a first frequency status indicator indicates a first industry standard frequency, a second frequency status indicator indicates a second industry standard frequency, a third frequency status indicator indicates a third industry standard frequency, and a fourth frequency status indicator indicates a fourth industry standard frequency.

6. The method of claim 5, wherein the first industry standard frequency is 800 MHz, wherein the second industry standard frequency is 1066 MHz, wherein the third industry standard frequency is 1333 MHz, wherein the fourth industry standard frequency is 1600 MHz, wherein the first industry standard voltage is 1.35 V, and wherein the second industry standard voltage is 1.5 V.

7. An apparatus comprising:
a processor; and
a computer readable storage medium having computer usable program code embodied therewith, the computer usable program code comprising a computer usable program code to:
receive, from an interface module, status data for a memory module by retrieving serial presence detect (SPD) information stored on the memory module, wherein the memory module includes a plurality of status indicators, the SPD information includes a frequency at which the memory module is operative and a voltage at which the memory module is operative, and the status indicators include a plurality of voltage status indicators corresponding to a plurality of industry standard voltages including the voltage at which the memory module is operative and a plurality of frequency status indicators corresponding to a plurality of industry standard frequencies including the frequency at which the memory module is operative;

determine, based on the status data, a set of the plurality of status indicators to illuminate;

generate, in accordance with a determination of the set of the plurality of status indicators to illuminate, a plurality of commands for controlling illumination of the set of the plurality of status indicators; and transmit the plurality of commands to circuitry of the memory module that controls the plurality of status indicators.

8. The apparatus of claim 7, wherein the memory module comprises one of a double in-line memory module, a single in-line memory module, a dynamic random access memory in-line memory module, and a small outline dual in-line memory module.

9. The apparatus of claim 7, wherein the status indicators are light emitting diodes.

10. The apparatus of claim 7, wherein a first voltage status indicator indicates a first industry standard voltage, a second voltage status indicator indicates a second industry standard voltage, a first frequency status indicator indicates a first industry standard frequency, a second frequency status indicator indicates a second industry standard frequency, a third frequency status indicator indicates a third industry standard frequency, and a fourth frequency status indicator indicates a fourth industry standard frequency.

11. The apparatus of claim 10, wherein the first industry standard frequency is 800 MHz, wherein the second industry standard frequency is 1066 MHz, wherein the third industry standard frequency is 1333 MHz, wherein the fourth industry standard frequency is 1600 MHz, wherein the first industry standard voltage is 1.35 V, and wherein the second industry standard voltage is 1.5 V.

12. An apparatus comprising:
a firmware interface module configured to,
receive, from a serial presence detect chip associated with a memory module, status-related information of the memory module, wherein the memory module includes a plurality of status indicators;
an input/output control module configured to,
receive, from the firmware interface module, the status-related information;
determine, based on the status-related information, a set of the plurality of status indicators to illuminate;
generate, in accordance with a determination of the set of the plurality of status indicators to illuminate, a plurality of commands for controlling illumination of the set of the plurality of status indicators;
a decoder module configured to,
receive, from the input/output control module, the plurality commands;
decode the plurality of commands; and
the memory module that includes a light emitting diode circuit, the light emitting diode circuit configured to,
receive, from the decoder module, the decoded plurality of commands; and
illuminate the set of the plurality of status indicators on the memory module, according to said decoded plurality of commands,
wherein a first status indicator of the plurality of status indicators indicates a single bit error, wherein a second status indicator of the plurality of status indicators indicates a multi-bit error, wherein a third status indicator of the plurality of status indicators indicates a frequency of 800 MHz, wherein a fourth status indicator of the plurality of status indicators indicates a frequency of 1066 MHz, wherein a fifth status indicator of the plurality of status indicators indicates a frequency of 1333 MHz, wherein a sixth status indicator of the plurality of status indicators indicates a frequency of 1600 MHz, wherein a seventh status indicator of the plurality of status indicators indicates a voltage of 1.35 V, and wherein an eighth status indicator of the plurality of status indicators indicates a second voltage of 1.5 V.

13. The apparatus of claim 12, wherein the interface module comprises a non-volatile chip having one of a universal extensible firmware interface code, an extensible firmware interface code, and a basic input/output system code.

14. The apparatus of claim 12, wherein the memory module comprises one of a double in-line memory module, a single in-line memory module, a dynamic random access memory in-line memory module, and a small outline dual in-line memory module.

15. The apparatus of claim 12, wherein the status indicators are light emitting diodes.

* * * * *